(12) United States Patent
Rosenzweig et al.

(10) Patent No.: US 8,947,115 B2
(45) Date of Patent: Feb. 3, 2015

(54) METHOD OF TESTING ELECTRONIC COMPONENTS

(75) Inventors: James Rosenzweig, Los Angeles, CA (US); Alex Y. Murokh, Encino, CA (US); Bernhard Hidding, Dusseldorf (DE)

(73) Assignee: Radiabeam Technologies, LLC, Santa Monica, CA (US)

( * ) Notice: Subject to any disclaimer, the term of this patent is extended or adjusted under 35 U.S.C. 154(b) by 895 days.

(21) Appl. No.: 13/042,738

(22) Filed: Mar. 8, 2011

(65) Prior Publication Data

US 2011/0240888 A1 Oct. 6, 2011

(30) Foreign Application Priority Data

Mar. 8, 2010 (DE) .......................... 10 2010 010 716

(51) Int. Cl.
G01R 31/305 (2006.01)
B01J 19/12 (2006.01)
G01R 31/28 (2006.01)

(52) U.S. Cl.
CPC .......... *G01R 31/2881* (2013.01); *G01R 31/305* (2013.01)

USPC .................................. 324/754.22; 250/492.3

(58) Field of Classification Search
USPC ............. 324/754.01–754.3; 250/492.1, 492.3
See application file for complete search history.

(56) References Cited

U.S. PATENT DOCUMENTS 5,179,279 A * 1/1993 Millard et al. .................. 850/63
6,476,400 B1 * 11/2002 Robinson et al. ........ 250/492.22

* cited by examiner

*Primary Examiner* — Tung X Nguyen
(74) *Attorney, Agent, or Firm* — Fulwider Patton LLP

(57) ABSTRACT

A method for testing the sensitivity of electronic components and circuits against particle and photon beams using plasma acceleration, in which the flexibility of the multifaceted interaction can produce several types of radiation such as electron, proton, ion, neutron and photon radiation, and combinations of these types of radiation, in a wide range of parameters that are relevant to the use of electronic components in space, such as satellites, at high altitudes or in facilities that work with radioactive substances such as nuclear power plants. Relevant radiation parameter ranges are accessible by this method, which are hardly accessible with conventional accelerator technology. Because of the compactness of the procedure and its versatility, radiation testing can be performed in smaller laboratories at relatively low cost.

5 Claims, 13 Drawing Sheets

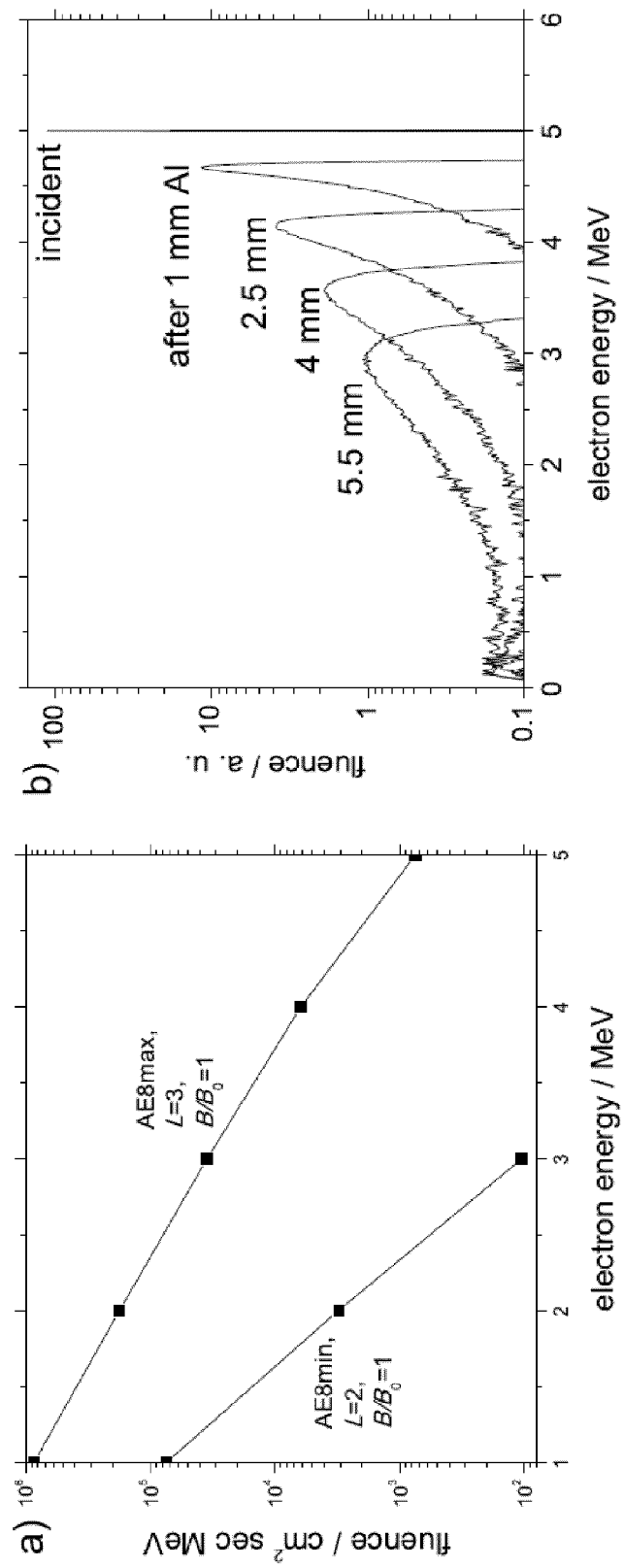
FIGS. 2A  FIG. 2B

METHOD OF TESTING ELECTRONIC COMPONENTS

RELATED APPLICATIONS

This application claims priority from German Provisional Application No. 10 2010 010 716.6, filed 8 Mar. 2010, the contents of which is incorporated in its entirety herein by reference.

BACKGROUND OF THE INVENTION

The present invention relates to a method for testing the radiation hardness of electronic components. This testing has high economic and industrial relevance because electronic components on board of satellites, space vessels, aircraft ("missiles") and in Earth-based nuclear facilities can be subject to extreme irradiation by different forms of radiation which can lead to malfunction of electronic devices and circuits if they are not adequately designed.

Each spaceship, each probe, each aircraft and, above all, each satellite is packed with electronic components. These components are critically important for the functioning of the missile. For this reason, the resistance of electronic components to be used on board missiles against various types of space radiation is tested extensively prior to launch. Moreover, it is not enough to test a certain electronic component only once. Due to variations found in the quality of different production batches of electronic components, it is typically desirable to conduct tests of electronic components intended for use each time a missile is assembled.

Electronic components such as computer chips, random access memory (RAM), transistors, solar cells and the like are sensitive to particle beams, such as beams of electrons, ions, protons, neutrons and other elementary particles, and are also sensitive to photon radiation such as x-rays. Such types of radiation can occur in space, and at high altitudes, with high intensity. (As used herein, the term "space" is used to refer to any aspect of space when radiation is a matter of concern.) The multiplicity of types of radiation in space is due to the fact that there are many different sources of radiation in space, and different mechanisms can underly the generation and acceleration of particles and other radiation in space.

For example, it is well-known that in the van Allen radiation belts (such as are illustrated in FIG. 2C, intense beams of so called "killer electrons" can occur. These sudden bursts of intense, high-energy electrons can be extremely destructive to both man and machine. Within the inner van Allen belt, it is mostly protons and ions that are collected and accelerated. These can be highly dangerous to spacecraft. However, encounters with high-energetic electrons occur mainly in the outer van Allen belt, where Medium Earth Orbit (MEO) satellites such as GPS satellites are positioned. The distance and the extent of the van Allen belts can vary substantially, so that lower and higher orbits can be affected, including geosynchronous orbits. Further, other astrophysical objects with magnetic fields such as Jupiter, Saturn etc. also create radiation belt electrons that might pose a danger to spacecraft.

The mechanisms for the acceleration of these relativistic electrons have been subject to intense discussion in recent years. According to NASA standard models AE8/AP8, accelerated and trapped electrons and protons in space have exponential, or "power-law," energy distributions. This fact means that most particles have relatively low energies, and fewer electrons have higher energies capable of deep penetration. The detailed process of how, for example, the electrons penetrate missile shielding and accumulate in insulations around satellite electronics, eventually causing catastrophic internal dielectric discharges, is strongly dependent on the energy distribution of the incoming energy flux. FIG. 2A shows two examples of electron energy spectra that can be expected to be encountered in space, calculated based on the AE8 model. One is calculated for an McIlwain parameter of L=2 during solar activity minima (AE8 min), the other for L=3 during solar activity maxima (AE8max). What is notable about FIG. 2A is that the distribution of the energy spectra shown is that they follow an exponential, or a power law, distribution. This fact is of significance to the present invention and its relevance will become apparent herein.

Similar exponential distributions occur in space elsewhere than in the Earth's van Allen belts and, in the radiation belts of other planets such as Jupiter, the electron energies can reach significantly higher levels than those in the van Allen belts. Energetic electrons can damage electronics in multiple ways, such as via the total ionizing dose (TID), or single event effects (SEE). Single event effects (SEE) are gaining increasing significance, as semiconductor structures are getting smaller. These single events triggered by bombardment of particles can have large detrimental effects and can be highly complex. Important SEE effects include:

Single Event Upsets (SEU). SEU are basically bit-flips, which occur when an energetic particle causes, for example, the state of a transistor in an electronic circuit to reverse. These phenomena can occur in nearly all microcircuits, microprocessors and memory chips.

Single Event Latchups (SEL). Energetic charged particles can activate parasitic transistors, which can then combine into a circuit with a large positive feedback, resulting in a short.

FIG. 2D illustrates how an unwanted pulse is generated by an SEU. An energetic particle leaves behind an ionization track in a transistor. The relevant charges produced along this track are mainly in the form of electrons and electron holes. These charges are collected at the source and at the drain, which results in a current pulse emission. This pulse can be as large as a normal signal applied to the transistor, which results in an unwanted electronic switching operation. A recent example of how harmful such an event can be was noted in an incident where the key space camera HIFI onboard the ESA space telescope Herschel failed following a SEU in the Local Oscillator Control Unit. This led to an emergency switch-off, which in turn resulted in an overvoltage spike and an overload, leading to permanent failure. Other kinds of single event effects include spurious pulses, permanent destruction of HEXFET transistor arrays, glitches in combinatorial digital circuits, temporary non-functionality caused by SEU bit-flips or mild latchups. The possibility of multiple failure modes due to space radiation generates a particular emphasis on radiation hardening and thorough testing of electronic components before they are sent into orbit. As a consequence, ground radiation hardening tests of electronic circuits and components intended for use in space is critical to the success of space programs. Typically, tested components are irradiated by proton or electron beams using ground-based accelerators, and the failure rates are measured as a function of cumulative radiation dose.

In light of the extreme radiation found in space and certain ground-based facilities such as nuclear power stations, manufacturers of missiles and nuclear power stations have developed systems for testing and hardening electronic circuitry before placing them in functional use. Typically, these tests have involved bombarding the electronic circuitry using particle beams from conventional particle accelerators.

However, ground-based conventional particle accelerators can not reproduce the exponential electron beam distribution spectrum that occurs in space, and a typical approach to ground-based radiation hardening testing involves investigating the impact of radiation at multiple monochromatic energies, and then extrapolating the results to other energies based on models and assumptions. These workaround methods are not only inaccurate, but also laborious and expensive, and sometimes inherently cannot capture the physics of specific situations that arise in space.

The primary deficiency in such ground-based approaches is that the naturally occurring space radiation environment energy spectrum (FIG. 2A) is dramatically different from the output of a conventional Earth-bound accelerator (FIG. 2B) because, on Earth, accelerators based on classical technology do not generate particle energy spectra that follow the exponential distribution found to characterize particle energy spectra in space, but instead give nearly monoenergetic distributions. Conventionally, such Earth based particle acceleration for testing has been done using radiation that is generated by the decay of radioactive materials such as Cobalt-60, in conjunction with conventional particle accelerators which are generally based on a radio-frequency cavity such a synchrotron. Furthermore, scattering of such monoenergetic beams in solid matter (e.g., satellite shielding) reshapes the beam energy distributions to forms that are even more unnatural and thus sometimes poorly suited to reproduce radiation that simulates space radiation and to explore its effects.

For example, consider a monoenergetic electron beam of energy E=5 MeV as produced by a conventional ground-based electron accelerator. Based on calculations with MULASSIS (a Geant4-based multilayered shielding simulation tool), we have evaluated the spectral change when the beam straggles through a mm-scale shielding based on a combination of aluminum and plastic. FIG. 2B shows the results of these calculations. It can be seen that during passage through the shielding, increasing numbers of lower energy electrons are produced, while the 5 MeV peak becomes less pronounced. By comparing FIG. 2A with FIG. 2B, it is evident that the electron spectra to be encountered in space and those producible on Earth by conventional accelerators are very different. In fact, the energy spectra generated on Earth after passing a monoenergetic beam through shielding look diametrically opposite to energy spectra encountered in space. Considering the energy-dependent stopping powers, it can therefore be concluded that such Earth based electron accelerators are far from well suited to simulate space electron radiation.

Thus, due to increasing miniaturization and computerization, and further due to the increasing number and complexity of space missions, the demand for "beam time" for ground-based component testing is ever increasing despite its shortcomings. In addition, due to increasingly complex mission profiles and increasing security needs, the influence of individual effects such as Single Event Effects ("SEE"), is becoming ever more important. Beam time at test facilities capable of testing such effects in wide parameter ranges is becoming ever more expensive.

Consequently, there is an increasing need in the art for an inexpensive and simple method for testing electronic circuits intended for use in space and other high energy radiation environments, that is capable of producing a broad spectrum of high energy particle radiation of multiple types. The present invention addresses these and other needs.

SUMMARY OF THE INVENTION

In a preferred embodiment, the present invention is a method of testing the sensitivity of an electronic component against radiation, wherein plasma excitation and acceleration is used for generating a radiation beam. The method comprises varying at least one beam parameter selected from the group consisting of: laser pulse energy, laser prepulse energy, electric drive pulse energy, beam duration, beam focus, beam size, beam wavelength, beam pulse, beam shape, and beam density. In a further step, the method includes producing a radiation beam having an energy distribution that is exponential or power-law. A further step includes irradiating an electronic component with the radiation beam.

In one aspect of the invention, the plasma excitation is laser-plasma-acceleration. Preferably, the exponential energy distribution is substantially the same as radiation energy distribution which occurs in the Earth's radiation belts. Yet a further step of the invention may include varying at least one target material parameter selected from the group consisting of: physical state (solid, liquid, gaseous or plasma), thickness, density, material, composition, structure, temperature, and shape, and, thereby producing different types of particle beams in a single beam, including at least two particle beams selected from the group of particles consisting of: electrons, protons, ions, neutrons and photons.

In another aspect of the invention, the method of the plasma excitation is plasma-wakefield acceleration. In this aspect, the exponential energy distribution is substantially the same as radiation energy distribution which occurs in the Earth's radiation belts. A further step of this aspect of the invention includes varying at least one target material parameter selected from the group consisting of: physical state (solid, liquid, gaseous or plasma), thickness, density, material, composition, structure, temperature, and shape, and, thereby producing different types of particle beams in a single beam, including at least two particle beams selected from the group of particles consisting of: electrons, protons, ions, neutrons and photons.

In another facet, the invention is a method of testing the sensitivity of an electronic component against radiation, wherein plasma excitation is used for generating a radiation beam. The method comprises varying at least one beam parameter selected from the group consisting of: laser pulse energy, laser prepulse energy, electric drive pulse energy, beam duration, beam focus, beam size, beam wavelength, beam pulse, beam shape, and beam density. The method may also include varying at least one target material parameter selected from the group consisting of: physical state (solid, liquid, gaseous or plasma), thickness, density, material, composition, structure, temperature, and shape, and, thereby producing different types of particles beams in a single radiation beam, including at least two particle beams selected from the group of particles consisting of: electrons, protons, ions, neutrons and photons. With this single beam, an electronic sample is irradiated.

In one aspect of this facet of the invention, the plasma excitation is laser-plasma-acceleration. Further, preferably, producing a single radiation beam includes producing a beam with an energy distribution that is exponential, and the exponential energy distribution is substantially the same as radiation energy distribution which occurs in the Earth's radiation belts.

In another aspect of this facet of the invention, the plasma excitation is plasma-wakefield acceleration. Further, preferably, producing a single radiation beam includes producing a beam with an energy distribution that is exponential, and the exponential energy distribution is substantially the same as radiation energy distribution which occurs in the Earth's radiation belts.

In yet another facet, the invention is a method of testing the sensitivity of an electronic component against radiation, wherein plasma wakefield acceleration is used for generating a radiation beam. The method comprises varying the beam density and the density of the ambient plasma electrons, so that the ratio of the beam density to the density of ambient plasma electrons is in the range of one to two. By this step a radiation beam is produced having an energy distribution that is exponential. In a further step, an electronic component is irradiated with the radiation beam.

In a preferred aspect, the method includes varying the plasma wave number and the rms bunch length of the beam, so that the product of the plasma wave number and the rms bunch length is in the range of 1 to 3, and preferably 1.5 to 2.5.

In yet a further facet, the invention is a method of testing the sensitivity of an electronic component against radiation, wherein plasma wakefield acceleration is used for generating a radiation beam. The method comprises varying the plasma wave number and the rms bunch length of the beam, so that the product of the plasma wave number and the rms bunch length is in the range of 1 to 3, and preferably 1.5 to 2.5. By this step, a radiation beam may be produced having an energy distribution that is exponential. In a further step, an electronic component may be irradiated with the radiation beam.

These and other advantages of the invention will become more apparent from the following detailed description thereof and the accompanying exemplary drawings.

BRIEF DESCRIPTION OF THE DRAWINGS

FIG. 2A shows electron fluence in space, showcases: L=2 in the AE8 min model and L=3 in the AE8max model.

FIG. 2B shows electron fluence change when an incident monoenergetic 5 MeV electron beam from a conventional accelerator is straggling through aluminum/plastic shielding.

FIG. 4 graphically represents plasma expansion calculated by multi-fs for a typical laser prepulse incident on a solid target.

DETAILED DESCRIPTION OF THE PREFERRED EMBODIMENTS

In conjunction with the Figures, preferred embodiments of the inventive method are described that utilize, under two aspects of the invention described herein, a compact and relatively inexpensive system, a single compact beam of radiation for testing electronic components to ascertain their resistance to various types of high energy radiation encountered in space.

In a first aspect of the inventive method, the approach of the invention is to utilize a known device that will accelerate particles such as electrons, protons, neutrons, and even ions, based on the interaction of a focused laser beam with matter. This known device is a Laser-Plasma Accelerator ("LPA"), for achieving laser-plasma acceleration. It is known that the LPA is capable of producing, in a single beam, many different types of radiation.

Yet, to date, this characteristic has not been recognized as providing a useful source of electron energy for the industrial application which is the subject of the present invention. In fact, most research and application of the electron beam that is produced by LPAs is directed to eliminating the broad spectrum of electron energy produced by LPAs in an effort to confine the resulting energy spectrum to a narrowly distributed range. The present invention on the other hand is directed to utilizing this characteristic that has otherwise been discarded by the scientific community as being a hindrance to desired research and usefulness.

Since conventionally used particle accelerators typically rely upon accelerating cavities in the radio frequency range to produce electric fields having in the order of a few tens of mega volts per meter, such accelerators need relatively long acceleration distances (as long as many miles) in order to achieve high particle energies. These conventional methods are therefore very cost- and maintenance-intensive. In contrast, the accelerating fields in known LPAs are higher than conventional accelerators by orders of magnitude, and may reach in the order of teravolts per meter. This means that acceleration distances for LPAs may be in the order of centimeters or less to achieve similar energies. Such LPAs are highly compact (table top) and can be built and operated much more cost effectively than conventional accelerator systems. In addition, the acceleration process in LPAs is capable of producing a particle beam with an exponential energy distribution. Furthermore by using an LPA it is possible to generate simultaneously a beam that includes a plurality of particle types. For example, electron and proton pulses can be generated simultaneously to be coextensive with each other in one beam.

Figure 1A:
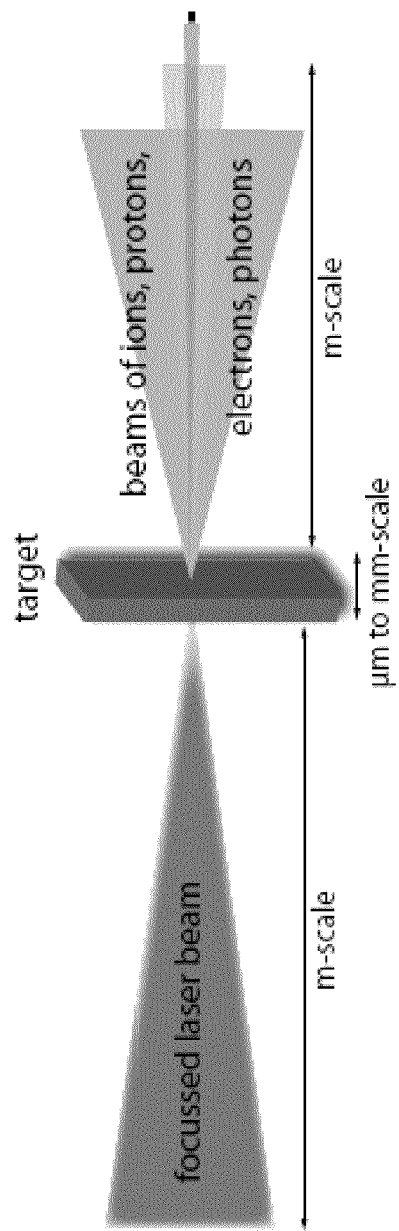
FIG. 1A shows a basic LPA scheme. A focused high-power laser pulse is incident on matter (solid, liquid, gaseous or plasma). Electrons are set into motion by focused electromagnetic fields, which can result either in relativistic pencil-like electron and photon beams propagating in the forward direction with low divergences, and/or in the generation of electrostatic charge separation which in addition to electrons leads to subsequent acceleration of protons and ions with broad-cone emission angles.
Figure 1B:
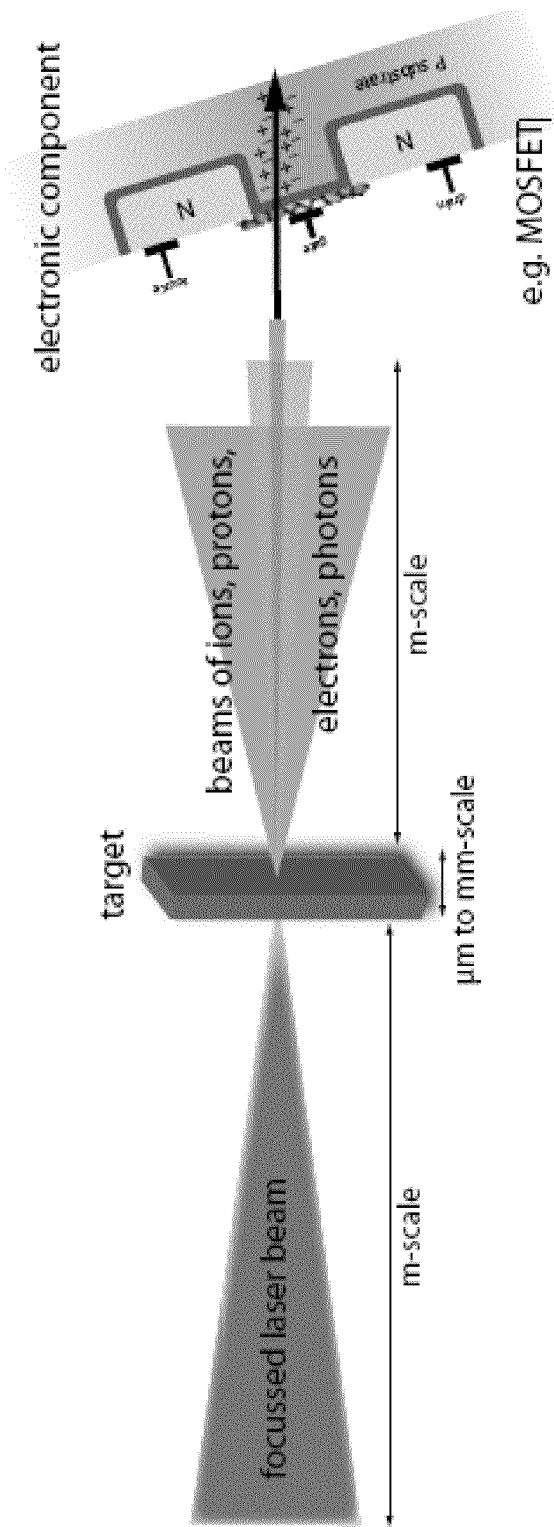
FIG. 1B shows a method, according to one aspect of the present invention, of testing an electric component using a known LPA device.

The basic setup used in a known LPA device is shown in FIG. 1A. A high-power laser pulse with pulse durations in the range of a few nanoseconds to a few femtoseconds, repetition rates in the range of single shots up to MHz, and energies from the micro-joules to kJ area, is focused in a vacuum chamber on a target material onto a surface of a few millimeters down to the sub-micrometer range. The target material can be either solid, liquid or gaseous, or already in the plasma state. Via various mechanisms, laser light will be absorbed in the focus and will be used to generate plasma leading to charge separation, and to accelerate charged particles (such as electrons, protons, ion and photon beams, and partly also neutrons) in the direction of the laser pulse and, or, into the target normal direction as well as in the opposite direction on the other side of the target. The particle energies thus achieved can be tuned in the range of a few electron volts to energies as high as giga electron volts. The electronic test components and circuits are placed either in the vacuum chamber or alternatively behind the wall of the vacuum chamber, where they are exposed to the radiation produced in this way. Then, their performance, function, and/or damage can be monitored. The electronic test samples can be operated either passively or actively. By appropriate choice of interaction parameters, the generated particle types, energy, divergence, beam duration and dose of the radiation may be controlled. For example, where solid target materials are used, the incident laser pulse and the interaction will produce an electron and proton beam with high divergence and high charge which can be used to irradiate a large area of test components. The tuning of the local dose applied to the test workpiece can be achieved both by choosing the laser and target parameters and also by simply varying the distance of the test workpiece from the laser focus or target. The maximum achievable dose can be orders of magnitude higher than what can be reached with conventional accelerators in a single shot, so that even extreme radiation effects that may occur in the universe can be studied in a terrestrial setting using the present inventive method.

Going into somewhat more detail, today's laser systems embodied in LPA technology are capable of generating ultra-high powers up to the petawatt-regime based on chirped pulse amplification (CPA). This scheme has been conceived in order to avoid the laser intensity exceeding the damage threshold of the amplifier media, which would destroy it. Instead, the pulse is stretched significantly in time using chromatic effects ("chirping") before amplification, for example by a grating system. Such long pulses can be amplified by several orders of magnitude without destroying the amplifier medium. After amplification, the pulse is recompressed to (ideally bandwidth-limited) the same duration as before stretching, yielding powers many orders of magnitude higher than those possible without CPA. When such laser pulses are then focused down to spot sizes of the order of few $\mu m^2$, intensities up to $10^{21}$ W/cm$^2$ can now routinely be reached with modern laser systems. The effects of such high intensity on media are wavelength-dependent. To see this, one introduces the dimensionless light amplitude $a_0 = eE/(m_0 \omega c)$, where e is the elementary charge, E is the electric field amplitude, $m_0$ is the electron rest mass, $\omega$ is the laser frequency and c is the speed of light. The $a_0$ factor describes the transition from the non-relativistic ($a_0 < 1$) to the relativistic regime ($a_0 > 1$), where the oscillation of electrons in the focused laser field is strong enough to cause relativistic mass increase and substantially alter the laser-matter interact ion. Using $a_0$, the laser intensity I can be expressed as $I = 2a_0^2 \in_0 c(\pi m_e c^2 / (e\lambda)^2 = a_0^2/(\lambda^2 [\mu m^2]) \times 1.37 \times 10^{18}$ W/cm$^2$. Typically, solid state lasers based on Ti:Sapphire media are used in CPA systems. Such laser systems are very compact, are often dubbed "table-top" and can easily fit into university-scale laboratories. Ti:Sapphire lasers amplify broadband radiation around a central wavelength in the near infrared at $\lambda_L$ equal to about 0.8 microns. With this wavelength, plasma electron relativistic mass increase effects begin asserting themselves at a focused intensity of I equal to about $10^{18}$ W/cm$^2$, corresponding to $a_0$ equal to about 1. In this scenario, the motion of electrons in the laser focus is becoming anharmonic, the magnetic field is no longer negligible, and there is a net longitudinal force on the electrons. At the same time, the maximum electric field amplitude $E_0 = 2\pi a_0 m_e c^2/(e\lambda) = 3.2 \times 10^{12} a_0/(e\lambda^2 [\mu m^2])$V/m is high enough to rapidly ionize media. Therefore media in the laser focus can be turned into a plasma, which is then the source of electrons susceptible to the intense laser field during the interaction process. While electrons can easily be moved by high-power laser pulses, the much heavier ions remain quasi-stationary in the first phase of the interaction. The generation of plasma, and the separation of electrons and ions due to the subsequent plasma electron motion driven by the laser, are the bases for laser-driven acceleration processes. In contrast to conventional radiofrequency cavity based accelerator techniques, where the accelerating fields are limited by ionization breakdown which sets in at few tens to few hundreds of megavolts per meter, plasma, already being ionized medium, can support electric fields which are many orders of magnitude higher. This fundamental feature is the reason why laser-plasma based acceleration or excitation is extremely versatile and can be carried out with enormously reduced equipment footprint and space requirement.

Types of radiation which may be produced according the LPA method, include energetic, partially relativistic beams of electrons and/or protons, such as those found in the radiation belts surrounding the Earth and other planets. Also, extremely dense particle showers can be produced. Such densities can not be generated with the strongest heavy ion accelerators based on conventional technology. With the present method, therefore, various aspects of secondary radiation types can be examined with greater fidelity to the kind of radiation to which the electrical components will be exposed in space. Furthermore, the present inventive method can also be used to study "Single Event Effects," which are becoming ever more important. For example, an especially important single event effect is the so-called Single Event Upset (SEU). Here, an energetic charged particle intrudes in the electronic component such as a transistor, and generates charge carriers in the form of electrons and electron holes, which then migrate to the source and drain, thus causing a current to flow that can be big enough to accidentally generate a signal leading to malfunctions and/or permanent damage in associated electrical circuits. Such high-energy particles (mostly protons or ions)

can be generated either directly with the present inventive method or, alternatively, their effects can be studied by laser-plasma-accelerated, quasimono-energetic, highly relativistic electron bunches. Since such laser-generated electron bunches are significantly shorter than typical electron beams produced by conventional accelerators by orders of magnitude, they can have extremely large transverse electric self fields even at relatively low total charges and can even overcome the ionization thresholds of matter. Since they can be focused to very small transverse dimensions in the micrometer range and in matter have sometimes very long intrusion depths, they have similar effects as high-energy cosmic particles when penetrating electronic components, and generate ionization tracks via formation of positive and negative charge carriers.

Figures 3A, 3B:
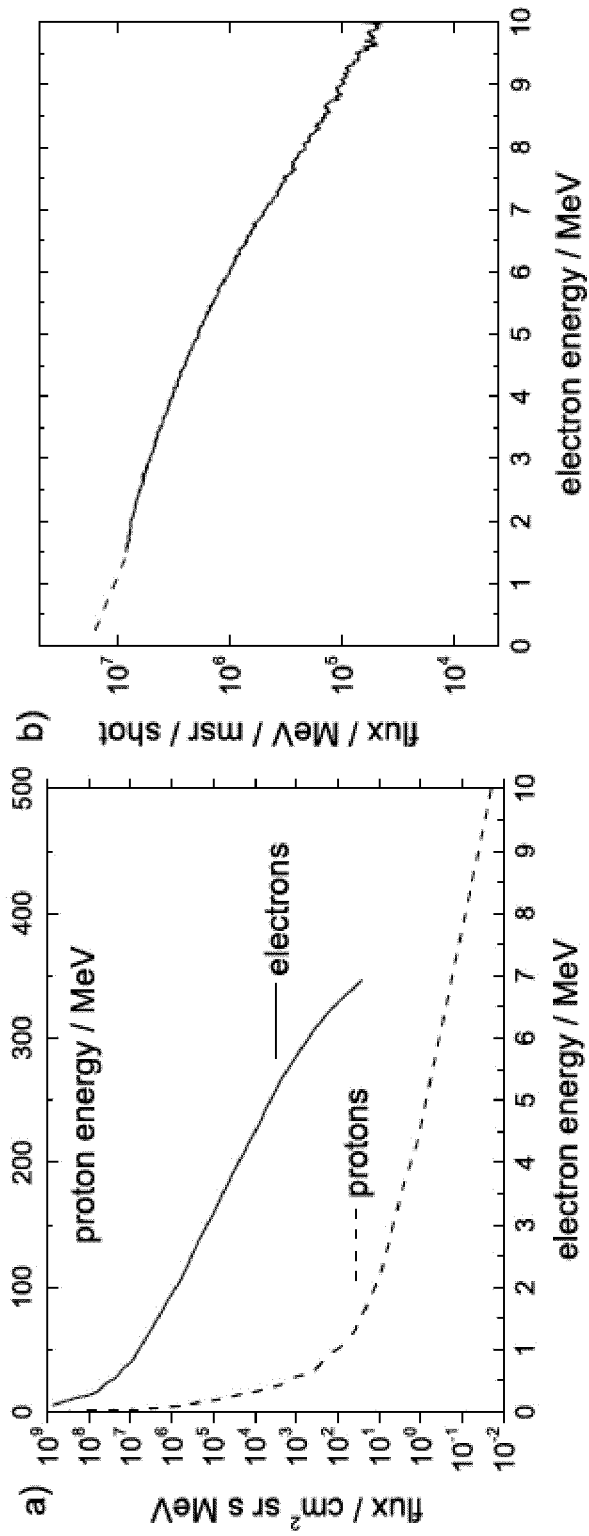
FIG. 3A shows electron as well as proton fluxes in the van-Allen belt on KuaFu-B satellite orbit according to NASA AP8 and AE8 models. The energies are in the MeV range and the spectra are exponential.
FIG. 3B shows a typical experimentally generated electron spectrum, which is producible with laser-plasma-accelerators.

Going into even further detail, LPAs are ideally suited to generate electron beams with characteristics such as those occurring in space in the Earth's van-Allen belt. This is demonstrated by FIG. 3, where in FIG. 3A electron and proton spectra as encountered during a satellite orbit according the NASA standard models AE8 and AP8 are plotted (here, the KuaFu-B satellite orbit was taken as a reference). In contrast, FIG. 3B depicts an example of a typical experimentally measured LPA-generated electron spectrum with exponential energy distribution. It will be noted that these are remarkably similar.

The temperature of the electron beam (i.e., its slope) can be adjusted by varying the laser intensity, in order to achieve a better agreement with the actual space electron spectrum. Also, although in both parts of the FIG. 3 the y-axis gives an equivalence of flux, the units are different (e.g., FIG. 3A gives flux per second, while FIG. 3B gives flux per laser shot). The net effect is that an electron spectrum with similar energy distribution to that found in space can in principle be reproduced and thus studied here on Earth. In contrast conventional accelerators cannot be used to produce such electron spectra at all, since the accelerator cavities act as energy filters.

As an example of parameters used to generate the spectrum depicted in FIG. 3B, a Ti:Sa laser pulse may be used with a pulse duration of $\tau$ equal to about 80 fs and an energy of E equal to about 700 mJ, yielding a power of P equal to about 7 TW. This pulse was focused to a focal spot of 5 $\mu m^2$ (FWHM), yielding a peak intensity of I equal to about $5 \times 10^{19}$ W/cm$^2$. A 2 micron thick titanium foil was positioned in the laser focus as a target under an angle of 10 degrees. There is always a more or less powerful prepulse linked to high-power laser pulses, so one has to take into account that this prepulse already might be intense enough to turn part of the target into a plasma. It is part of the present invention to use a prepulse to steer the interaction characteristics and thus the radiation output of the interaction. Hydrodynamical tools such as multi-fs can be used for this.

Figures 4A, 4B:
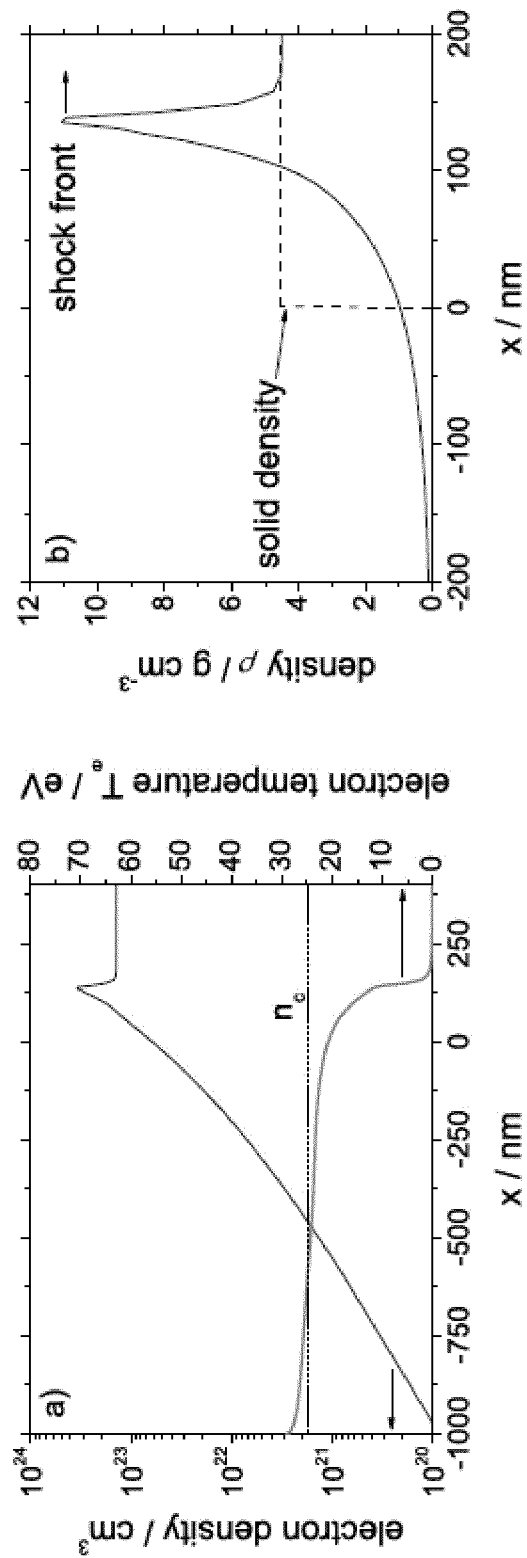
FIG. 4A is a plot showing the scale length of the plasma density amounts to about 200 nm, while the electron temperature is approximately 20 keV.
FIG. 4B is a plot of the ion density corresponding with the plot of FIG. 4A.

FIG. 4 shows the estimated status of plasma expansion due to the prepulse (which has a peak intensity which is in the present case about four orders of magnitude lower than the peak intensity of the main pulse) which arrives at the target about 4 ps before the main pulse as calculated with multi-fs. In FIG. 4A the plasma electron density and temperature are plotted, while in FIG. 4B, the ion density is given. The laser pulse is incident from left to right. Plasma electrons are expanding outwards into the vacuum, and form a preplasma with having a temperature of about 20 keV (FIG. 4 $a$), right axis). The expansion in terms of the much heavier ions is depicted in FIG. 4B. With the dashed line, the unperturbed initial solid density profile of the titanium foil (density $\rho$ equal to about 4.5 g/cm$^3$) is given here, while the solid line gives the density profile after the prepulse, when the main pulse arrives.

Next to outward ion expansion into the vacuum, ions are also driven into the solid, where they generate an inward travelling shock front.

In contrast to particle beams generated by classical cavity-based accelerators, where the cavities act as energy selectors and filters and inherently produce monoenergetic beams, the generation of electron beams with exponential energy spectra are within the capability of laser-plasma-interaction. In fact, even in the pre-CPA (chirped pulse amplification) era, scalings had been developed which can be used to predict the temperatures of the exponential electron beams and have been further developed as relativistic laser intensities had become routinely accessible. The effective electron temperature follows a $T_{eff} \alpha (I\lambda^2)\_$scaling, the exponent $\zeta$ typically amounting to values between ½ and ⅓. A $\sqrt{I}$ dependency of the temperature was found for the intensity range from $I\lambda^2 \approx 1.3 \times 10^{18}$ to $I\lambda^2 \approx 1.4 \times 10^{19}$ W$\mu m^2$/cm$^2$ and which is $T_{eff,Wilks} = [(1+I[W/cm^2]\lambda[\mu m]^2/(1.37 \times 10^{18}))^{0.5}-1]m_0c^2$.

Other experimental works with sub-ps laser pulses and intensities up to $10^{19}$ W/cm$^2$ [21] lead to the slightly different scaling $T_{eff,Beg} = 0.1(I_{17}\lambda^2)^{1/3}$ MeV where $I_{17}$ gives the intensity in multiples of $10^{17}$ W/cm$^2$. This scaling yields $T_{eff} = 2.0$ MeV for the experimental parameters as described above.

Figure 2C:
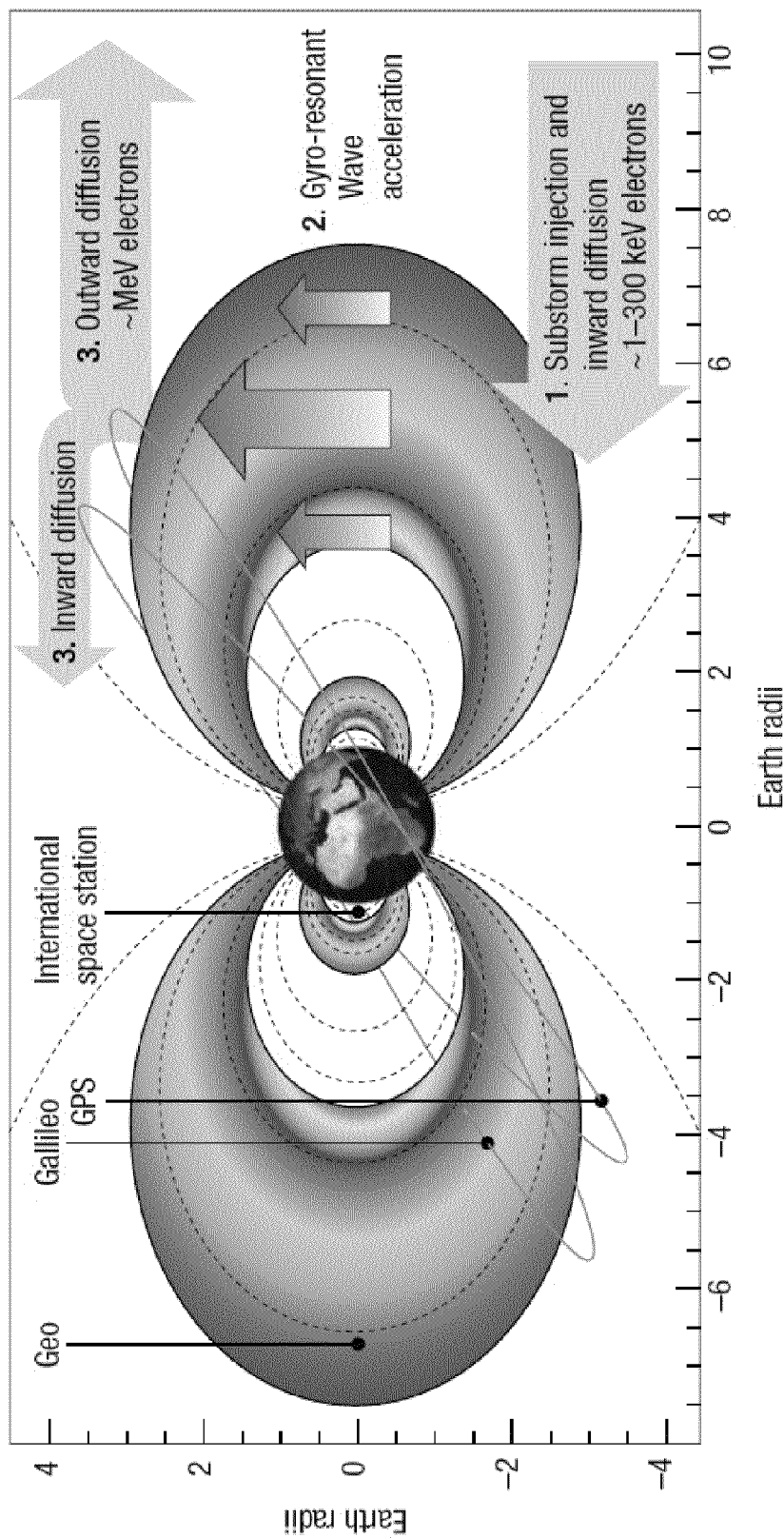
FIG. 2C shows an explanatory model for the stochastic acceleration of electrons in Earth's radiation belts to relativistic energies and exponential energy distributions.
Figure 2D:
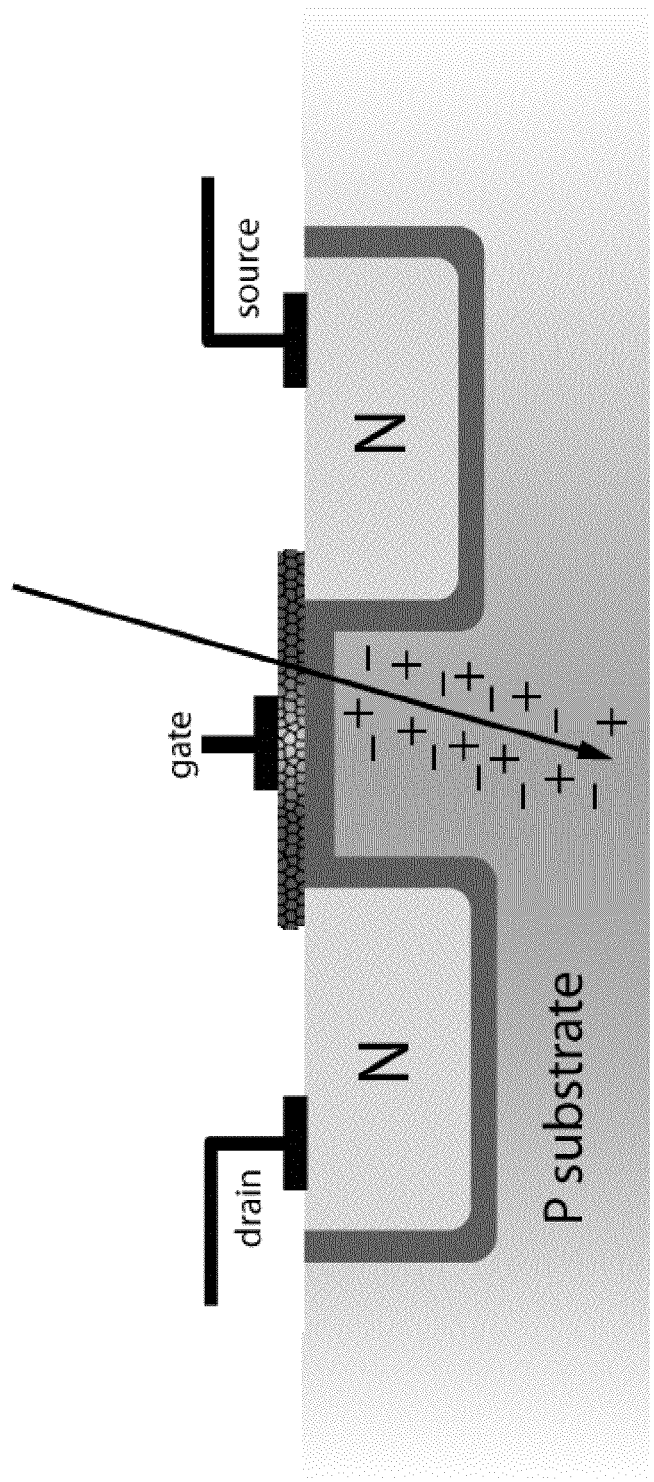
FIG. 2D shows an energetic cosmic ray generating an ionization track, which can be serious enough to cause parasitic switching of the device.

Thus, by changing the intensity, and by changing the pre-plasma parameters, one can effectively steer the temperatures of the generated electron beams to emulate electron beam radiation in space with unprecedented level of realism. For example, the temperatures in FIG. 2A can be reproduced in Earth-bound testing by changing the incident laser intensity of a laser-plasma-accelerator. In practice, this can be done via various parameters, for example by changing the laser pulse energy, duration or simply by moving the target on the sub-mm scale outside of the laser focus. Not only the electron beam temperature, but also their divergence follows intensity-dependent scalings. By increasing the intensity, the divergence of the electron beam is increased. The divergence is important for radiation effects, because it strongly influences the doses received by electronic samples. Broad divergence of electron beams can have several advantages. On the one hand, one can change the dose incident on the sample by orders of magnitude simply by adjusting the distance of the sample to the laser target. In addition, very broad areas can be irradiated. This is in diametral contrast to conventional accelerators based on rf-cavity technology, since these cavities act not only as energy filters, but also as divergence filter, rendering the output beam needle-like. The fluences and the absorbed dose per laser shot attributable to electrons depends on the distance to target. The total electron beam charge can be of the order of tens of nC. The exponential spectrum means that most of the electrons are of low energy and therefore have comparably low penetration depths. As noted above (compare FIG. 2 and FIG. 3), the same situation exists in space, where the outer shielding receives most of the charge and dose, but the higher energy electrons can penetrate.

Figures 5A, 5B:
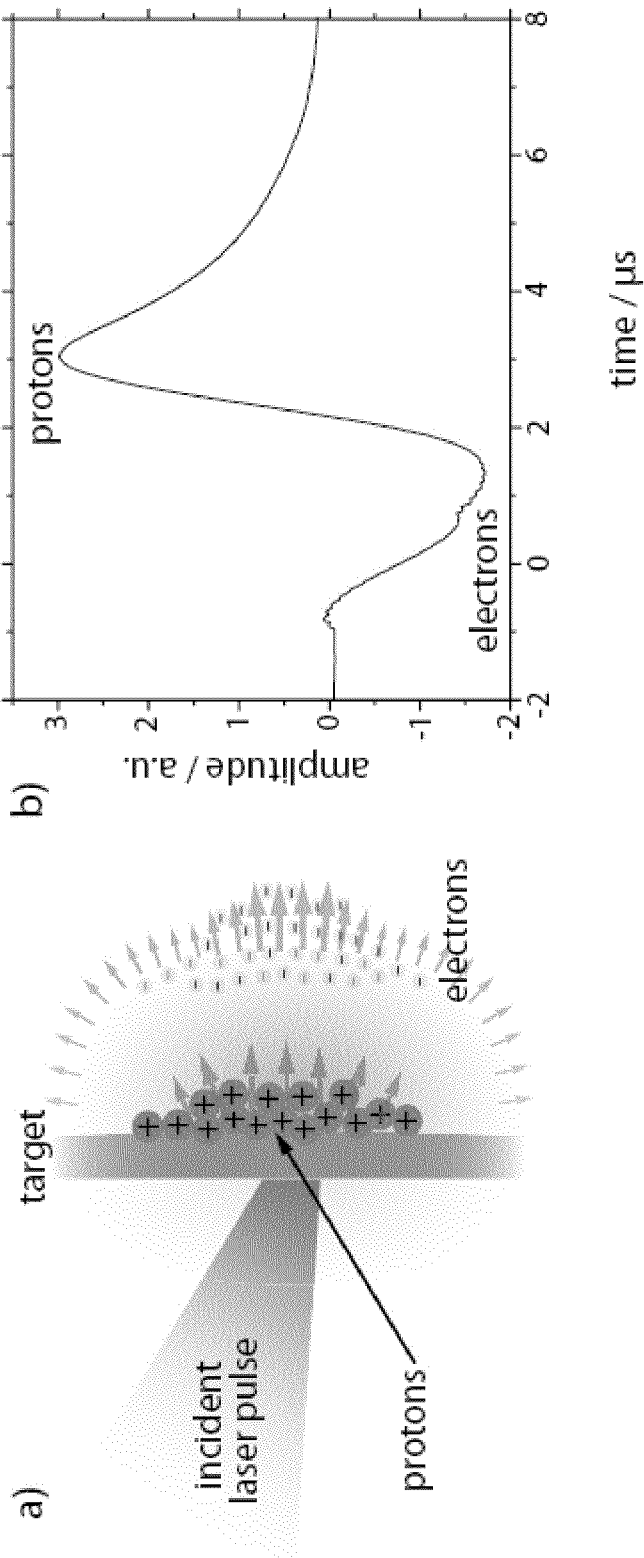
FIG. 5A is schematic depiction of a laser beam impacting a target to discharge both electrons and protons.
FIG. 5B shows a plot of a typical signal at Faraday cup due to plasma expansion.

During laser-plasma-interaction with solids, it is not only electrons that are accelerated, but as a secondary effect, protons and ions are also accelerated. The lightweight electrons move first, but while the most energetic electrons forming the tail of the exponential spectra can have energies of many tens and even hundreds of MeV, most of them gain energies which are limited to the (multi-)keV range. These moderately hot electrons form quasi-stationary electrostatic fields which are strong enough and live long enough to set the comparatively heavy positively charged protons and ions at the target outer faces in motion. (See FIG. 5A) This process is commonly called Target Normal Sheath Acceleration (TNSA) and is the dominant scheme for laser based proton and ion acceleration.

Typically, the acceleration process leads to exponential proton and/or ion energy spectra, too. Proton energies up to tens of MeV can routinely be generated. Similar to electrons, proton beams with exponential or power-law energy distributions characterize the major part of protons occurring in space (compare FIG. 3).

Therefore, as a fundamental point of innovation of the present invention, and to accommodate reliability and safety considerations in space technology, the method of the present invention is to apply these laser-generated exponential beams for space radiation effect testing and studies. Proton beams generated by laser-plasma-interaction typically are emitted in a cone with opening angles similar to electron beams. Typical values are approximately 10 degrees to 30 degrees. Protons, due to their high stopping powers, have much less penetration depths in matter than electrons of comparable energy. In addition, the energies of protons typically are significantly lower than those of the simultaneously produced electrons. This means that the deposited doses close to the target due to protons can easily amount to kGy or higher. Therefore, one can place the test samples substantial distances away from the target, still being able to receive high doses, and at the same time having the option to harvest large-area irradiation. While the majority of electrons in the van-Allen belt have energies up to 15 MeV, protons can have energies up to hundreds of MeV. In contrast, while LPAs are easily able to produce electron spectra up to even hundreds of MeV, the high energetic protons encountered in space are currently well beyond the limit of what LPA devices are capable of generating. However, it should be pointed out that one of the most important aspects of LPA generation is the capability of generating exponential energy spectra, and even the tens of MeV cutoff limit which is currently the LPA limit for protons, are very useful for electronics testing (even energies of about 1 MeV can be very useful for testing). As regards ion energies, multi MeV/u acceleration of ions such as carbon and various other types of ions, including heavy ions, have been demonstrated, and schemes for acceleration up to multi-GeV energies of ions are currently being developed.

Figure 6:
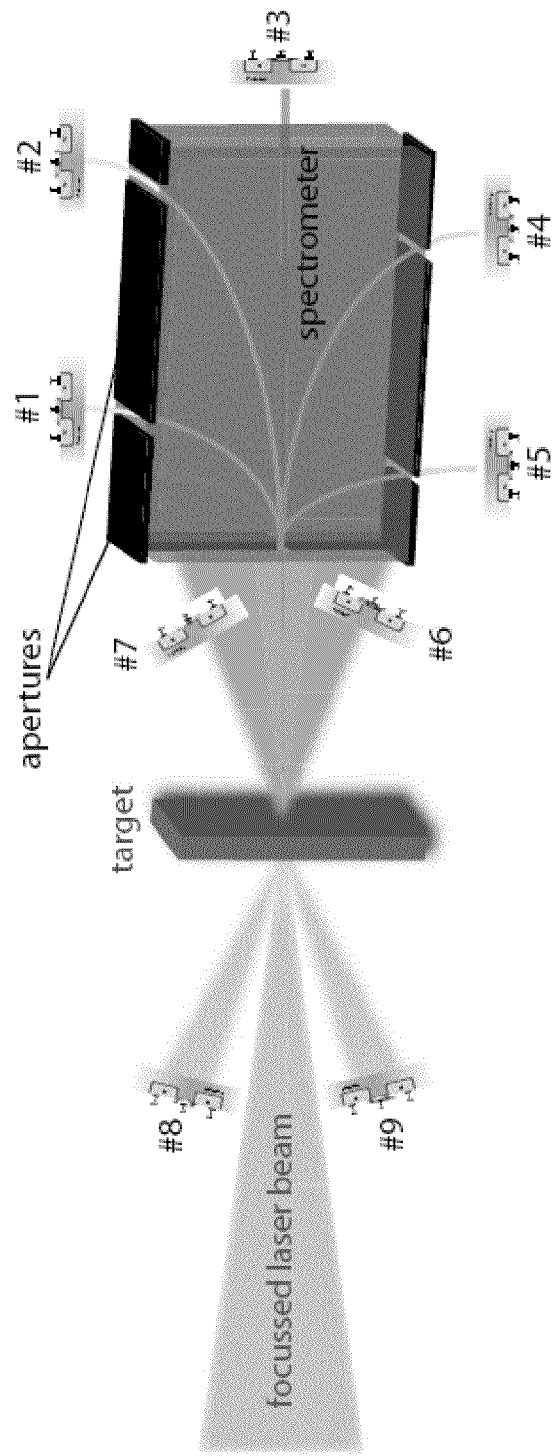
FIG. 6 shows a schematic representation of a multiple, simultaneous component testing scheme in one aspect of the present invention. The exponential-energy electrons and protons/ions generated during a laser shot are deflected according to their energy and mass in a magnetic field based on permanent magnets. Multiple measurement ports (e.g., #1-#9) are possible to test multiple samples during the same shot.

In this context, it should be noted that MeV electrons are also very useful to examine certain effects of space proton irradiation. As a basic principle of LPA the electrons are moved first (or faster) by the laser, while protons and ions, due to their higher masses, have much slower velocities even at MeV energies. This means that emitted protons lag behind the faster electrons, and the time taken to move a certain distance can be measured with Faraday cups. See for example FIG. 5B which shows that electrons take a shorter time than protons to cover a certain distance after being discharged from the same surface. This demonstrates vividly, how electron and proton beam emission are connected. It furthermore means that normally one will have both electrons as well as protons (and ions) impinging on the test sample as the result of a single laser shot. However, it is possible to separate electrons from protons and ions in magnetic fields due to their opposite charges. Although the particle beams with exponential energy distribution are a far more realistic particle source when it comes to modeling space radiation when compared to conventional, monoenergetic beams are useful to examine the effect of particle irradiation with varying intrusion depths and energy deposition. This can be easily done with LPAs, too. Since beams with exponential energy distributions simultaneously provide all energies up to their cutoff energy, energy resolution via magnetic fields or via quadrupoles can be used to "cut out" a specific energy from the exponential spectrum. By translating the electronic test component in the detection plane, smooth energy tuning can be performed. This is at the same time convenient and advantageous, because changing the output energy in conventional accelerators can be time-consuming, and by far not every accelerator is designed to deliver any energy desired by the experimentalist. Since protons and electrons are deflected in opposite directions, various ports for different measurements exist. For example, the response of one component towards lower-energy electrons may be examined, while another one could be positioned where high-energy electrons leave the magnetic deflector device. Simultaneously, on the other side of the spectrometer, the incidence of protons on electronics may be tested. In addition, on axis behind the target, particle-free irradiation of electronic components with electromagnetic noise generated during laser-plasma-interaction may be used. FIG. 6 summarizes an ultra-versatile structure for multi-testing of electronic components based on laser-plasma-interaction with solid targets. Various testing ports are shown in FIG. 6, permitting multiple electron-only (e.g., ports #1 and #2) as well as proton/ion-only (e.g., ports #4 and #5) testing at discrete energies, needle-like testing with photons (port #3, on axis), as well as combined, large-area electron/proton/ion testing with exponential energy distributions (e.g., ports #6 to #9).

Figure 7:
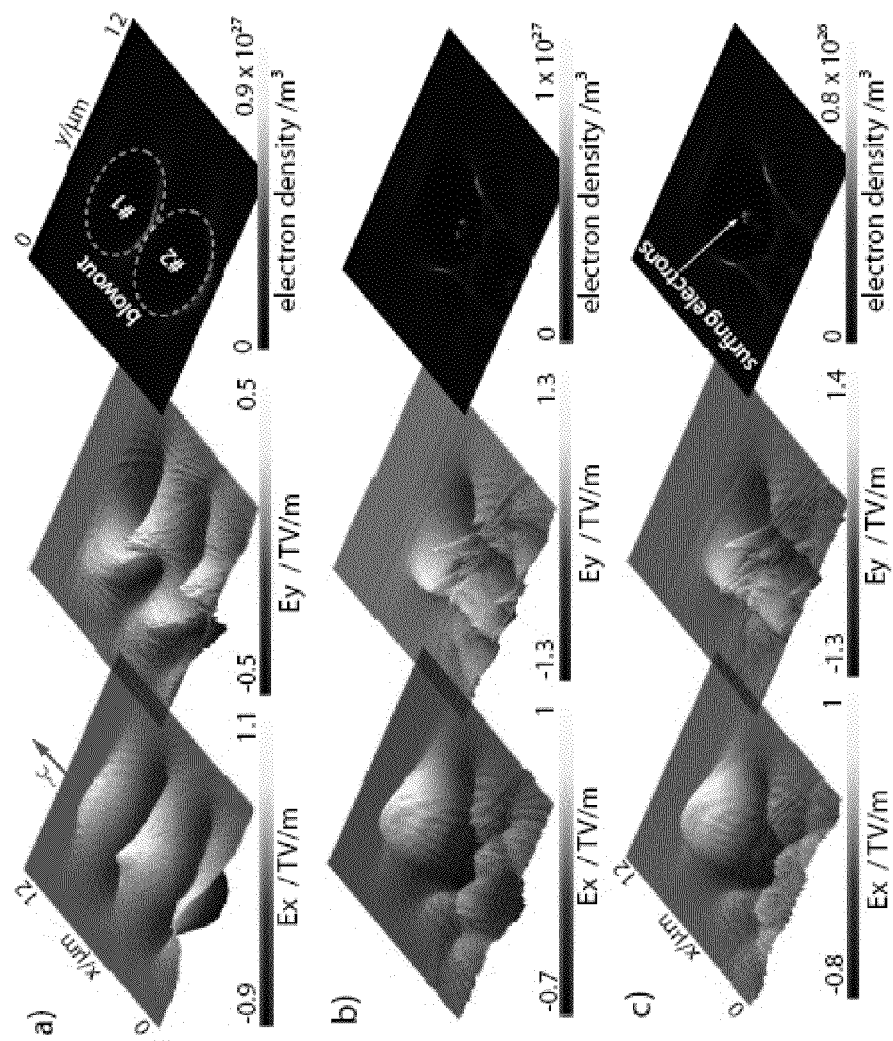
FIG. 7 is a graphic illustration of Laser-plasma wake field acceleration of monoenergetic electrons. a) Longitudinal (left) and transversal (middle) electric plasma fields, and according electron number density at the beginning of the laser-plasma-interaction. b) After 150 fs, electrons are already injected from the vertex of the plasma cavity. c) After 190 fs, a monoenergetic electron bunch has formed in the middle of the plasma blowout/bubble.

Besides the outstanding ability of LPAs to generate particle beams with exponential energy distribution, there is another mode of laser-particle acceleration by which it is possible to generate electron beams with quasimonoenergetic energy distribution and ultrasmall dimensions. The present invention also utilizes these electron bunches for space radiation studies, too, for example as a unique method of simulating the ionization effects of high energy particles. Already in 1979 the laser-based acceleration of electrons had been proposed. Later it was shown, that a relativistic (electron beam) driver pulse can very effectively expel electrons away from its propagation axis due to their high radial electric fields, leaving behind the quasistationary positive plasma charges and a nearly electron-free plasma "blowout," which ploughs through the plasma at the same speed of the driver. The extensive charge displacement causes high electric wake fields which can be used to accelerate electrons. FIG. 7 visualizes this acceleration mechanism with the help of snapshots of the laser-plasma-interaction retrieved from a particle-in-cell simulation code. In FIG. 7, the time evolution of the electric fields and the electron plasma density are given for three different points of time:

a) at the beginning of the interaction,
b) after 150 fs, and
c) after 190 fs.

The simulation assumes a (Gaussian) FWHM laser pulse duration of $\tau=10$ fs and a peak (vacuum) focus intensity of $I=8\times10^{18}$ W/cm$^2$, and a plasma electron density of $n_e\approx3.2\times10^{25}$ m$^{-3}$. At the beginning of the interaction, the longitudinal electric fields (see FIG. 7 a), left hand side) of the plasma wave, which is running in x-direction with approximately the speed of light $v_{ph}\approx c$, are very homogeneous. The plasma wavelength, which is defined by the plasma electron density ne, amounts to $\lambda_p=c[4\pi^2\epsilon_0 m^2/(n_e e^2)]^{1/2}\approx 6$ µm, where m and e are the electron mass and charge, respectively. Two consecutive wave buckets are shown behind the driving laser pulse (not visible here), the longitudinal fields amounting to 1.1 TV/m (decelerating, at the front of the bucket) and −0.9 TV/m (accelerating, and the end of the bucket). The transversal electric fields (depicted in the middle of FIG. 7(a) are of the same order of magnitude and exert electron defocusing forces in the first half of the blowout and focusing forces in the second half of the bubble. It is these ultrahigh fields that lead to trapping and acceleration of electrons in the plasma wave. However, as of yet, as can be seen in the right part of FIG.

7(a), there are not yet any electrons injected and trapped in the plasma blowouts. However, the situations changes within a few hundreds of fs, corresponding to less than 100 microns, as can be seen in FIG. 7(b). As is revealed by the electron density plot on the right hand side of the Figure, electrons have already been injected in the (first) plasma blowout and can harvest its accelerating and focusing co-moving electric fields. The exact mechanisms of self-injection and trapping into the "blowout" or "bubble" can be complicated. Here, it is important that it is now possible to produce electron bunches with durations as short as $\sigma_b \approx 2$ fs, lateral sizes of $\sigma_r \approx 200$ nm, and charges Q of tens of pC. The electric self-fields of electron bunches scale favorably with beam dimensions, the radial field being $E_r(r)=Q/[(2\pi)^{3/2}\sigma_z\epsilon_0 r](1-\exp(-r^2/(2\sigma_r^2)))$, where $\sigma_z$ is the length of the bunch. As can be seen from FIG. 7, the electric fields can approach the TV/m-regime. These are values which are beyond the ionization thresholds even of gasses. In addition with the high energies of the bunch electrons, which can be as high as more than a GeV with energy spreads down to about 1%, these bunches and the connected electric fields would travel through matter like "relativistic ionizing arrows" with penetration depths into solid matter up to the meter scale. In electronics, they would leave behind an intense ionization track which could be used to study single event effects such as those generated by cosmic-ray particles. This unique property of such laser-plasma-generated electron bunches is completed by the tiny dimensions of the bunches, which are of the order of the smallest structures which are used in modern microelectronics. Therefore, ionization events and tracks would be similar to those generated by cosmic-particle impacts. Such high-energy nuclei (HZE particles) have also high penetration depths and are highly charged and therefore, very densely ionizing.

Thus, the first aspect of the present inventive method comprises utilizing an LPA system as above described to generate a high energy beam having radiation energy distribution properties that simulate the radiation energy distribution properties found in space. Using a beam with such properties, electronic components are tested for radiation hardness using known test protocols.

In a second aspect of the present inventive method, another preferred method of testing electronic components for use in space is described. This second preferred method comprises using Plasma Wake Field Accelerator (PWFA) technology to simulate the space radiation environment at ground-based test facilities.

To date, PWFA research has been limited mostly to the advanced acceleration R&D (AARD) program. However, the unique features of plasma-beam interaction, such as strong longitudinal modulation of the plasma wake, make it possible, under certain novel and inventive circumstances described herein, to use the scheme to generate exponential energy spectra beams which resemble certain space radiation environments with a high degree of accuracy.

Of importance to the present inventive solution to the problem of earth based testing of electronic components for use in space, it is important to note that a complementary, and in many ways a result similar to the spectrum produced by LPA can be achieved with plasma wake field acceleration (PWFA), where a plasma wake is driven by electron bunches from a photoinjector, or a related electron source capable to generate or compress electron bunches. One advantage achieved by using PWFA is that a high repetition rate can be achieved in comparison with the results achievable with LPA.

Figure 8:
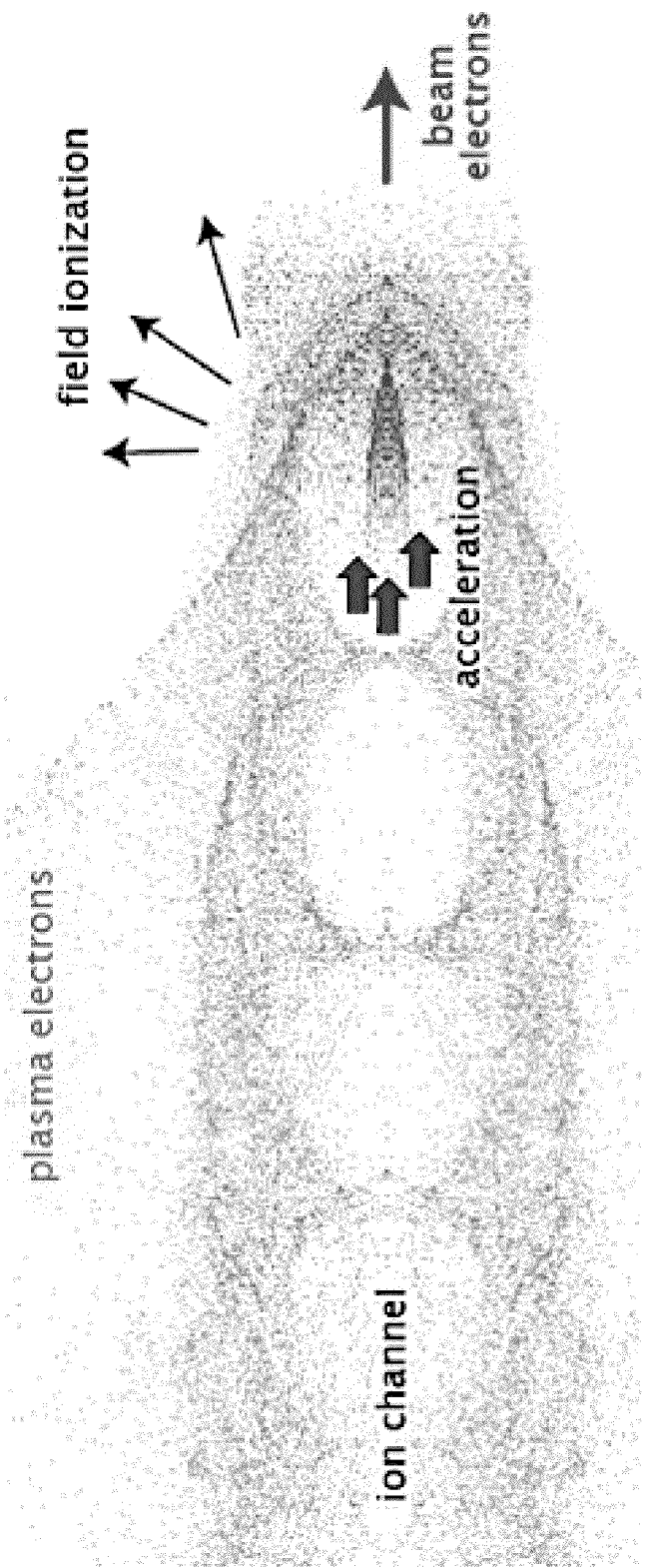
FIG. 8 is a schematic representation of a basic scheme of the PWFA principle: as a relativistic electron beam passes through plasma, it expels the electrons and leaves behind an ion channel. The wake of the expelled electrons returns to the beam axis and has a longitudinal field component that can accelerate electrons in the back of the beam.

In the PWFA scheme applied to the problem described, the electron beam space charge field expels plasma electrons along its path, which creates an ion channel, with amplitude modulation as a function of longitudinal position with respect to the head of the electron beam (FIG. 8). As a consequence the corresponding longitudinal wake field is also modulated and can either accelerate or decelerate electrons depending on their relative longitudinal position within the beam. Hence, there is a significant beam energy broadening that can occur in PWFA accelerators. The subject of this invention is identify circumstances under which this broadening can be made exponential, power-law, or generally be shaped to similar energy spectra characteristics as found in space and described more fully above.

Thus, the present invention, in contrast, aims at achieving a new use. For space radiation test cells it is preferred to inject monoenergetic electron beam of say 4-5 MeV (short pulse, high charge driver), and generate on the output a spectrum that extends from non-relativistic energies (<1 MeV), to over 10 MeV. This requires decelerating, to nearly stopping, the core of the beam, while simultaneously accelerating the tail. It can be seen from preliminary simulations, given below, that the resultant energy spectrum after this type of PWFA interaction is indeed nearly exponential over the range of energies required to simulate energy spectra found in space, for example.

Figure 9:
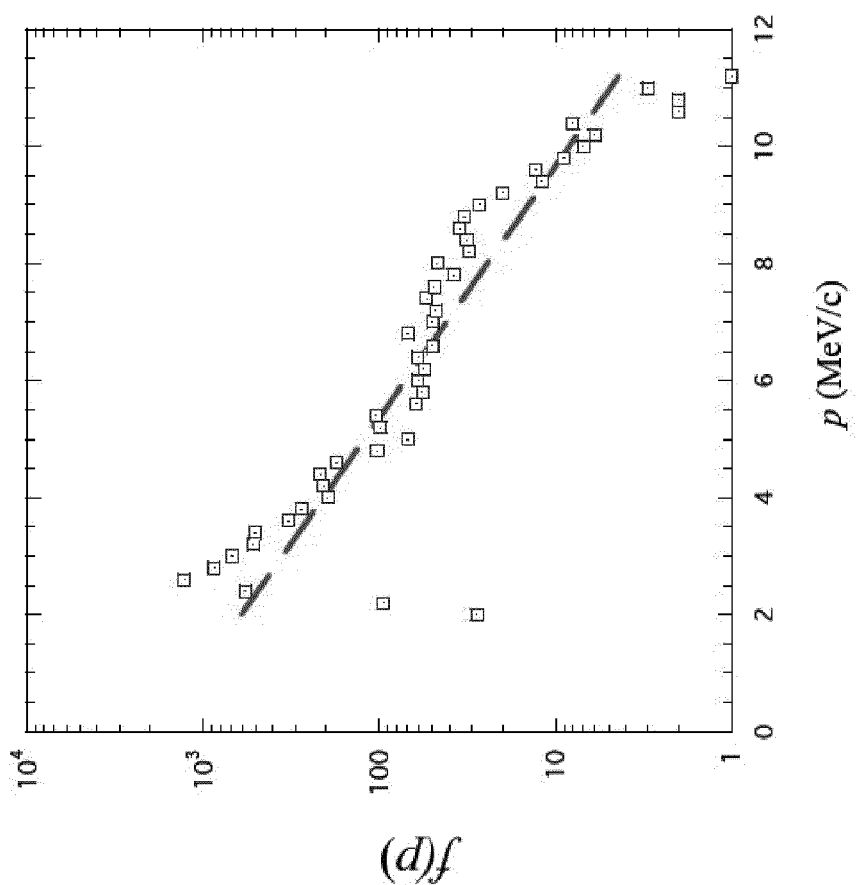
FIG. 9 shows state-of-the-art particle-in-cell computer simulations of beam momentum spectrum at the plasma exit, with exponential fit shown, using electron beam parameters displayed in Table 1.

To achieve a desirable exponential spectrum it is beneficial to use a linearly ramped electron drive beam, which has recently drawn considerable attention, as it is the most efficient beam shape for plasma wake fields excitation. However, since the focus of this inventive method is on providing a practical system for industrial applications, simplicity is a key and it is desirable to avoid complex beam tailoring techniques. Hence, to illustrate the predicted performance of the present inventive method, we chose a conventional Gaussian shaped beam with normalized length, and performed a preliminary set of simulations using a state-of-the-art particle-in-cell computer simulations. (Particle-in-cell plasma physics simulations are commonly used to improve plasma physics education, to solve challenging problems in basic research, and to aid in plasma-processing equipment design, analysis and optimization. Their capabilities enable equipment and process engineers and industrial researchers to solve problems in design, optimization, and to diagnose problems faster and cheaper.) The outcome of our simulation demonstrated a nearly exponential electron beam spectrum (FIG. 9), indicating very close resemblance to the space radiation background displayed in FIG. 2A. The parameters used in this simulation set are found in Table 1, below.

TABLE 1

Parameters for state-of-the-art particle-in-cell computer simulation of PWFA interaction

| Beam Parameters | Value |
| --- | --- |
| Bunch initial energy | 4.3 MeV |
| Bunch length (rms) | 0.6 mm (2 ps) |
| Bunch initial spot rms size | 100 mm |
| Normalized transverse emittance | 4 mm-mrad |
| Plasma density | $3 \times 10^{14}$ cm$^{-3}$ |
| Normalized bunch length | 2 cm |
| Plasma length | 4 cm |

Figure 10:
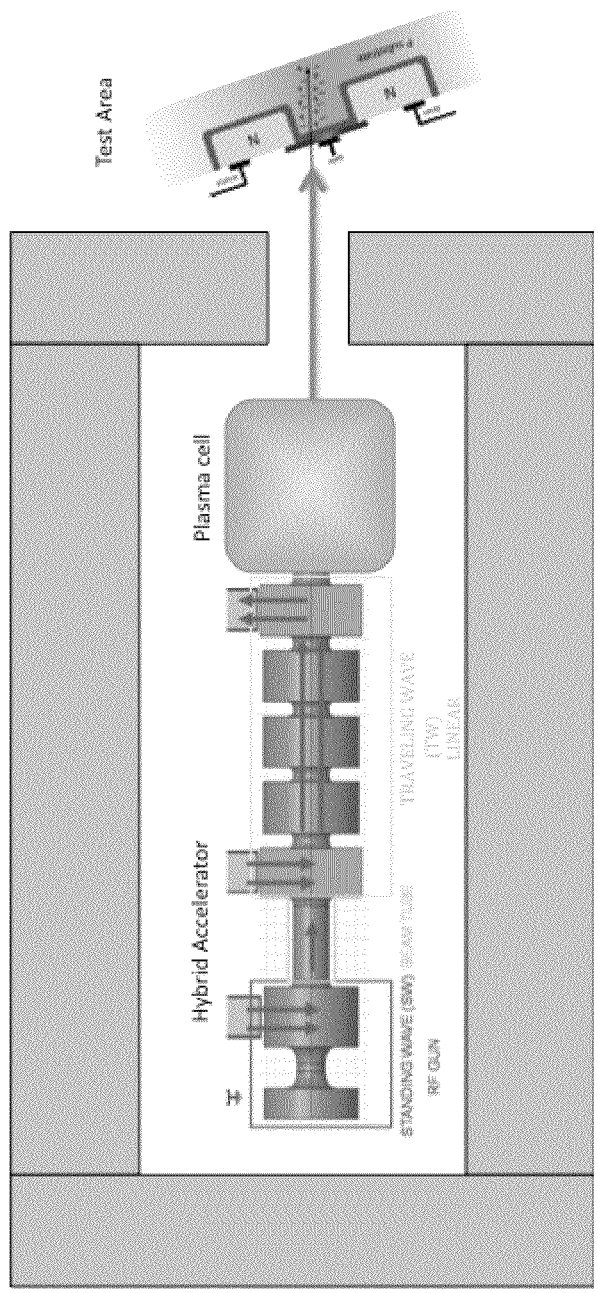
FIG. 10 shows a schematic drawing of a photoinjector hybrid driven PWFA source for radiation hardened electronics testing.

The initial simulations of this device indicate that, as an example, one may have 4.3 MeV, 2 nC beams that are compressed within the device to about 2 ps rms. This bunch will have good transverse emittance, as it undergoes emittance compensation during compression. Following our prescription on bunch length, the optimized plasma density for this beam should be about $3 \times 10^{14}$ cm$^{-3}$, and development of such plasma cell is straightforward. A complete stand-alone PWFA system for space radiation studies, which includes a photoinjector hybrid, RF power source, and a plasma cell for exponential spectrum generation is exemplified in FIG. 10. The system may have a relatively high repetition rate of about 50 Hz, or even higher.

We now describe the application of the beam characteristics to the problem identified in the background section, that of mimicking the space radiation environment. As has already been noted, this is a critical application, as damage of spacecraft electronics in radiation belts presents many challenges in mission survivability. Space radiation has diverse sources and may consist of electrons, protons, ions and photons. In accelerating the charged particles, unlike in standard man-made accelerators such as linacs (linear accelerators), that function well only in producing nearly monochromatic particle beams, acceleration in nature is often stochastic due to the existence of many competing resonant waves. This scenario as a rule leads to energy spectra characterized by an exponential or power-law distributions.

Recognizing the need for such exponential spectra, the first aspect of the invention proposes that a laser wakefield accelerator, or LPA, be used to mimic space radiation environments. This approach is based on capture of electrons from the background plasma by waves excited with fs-duration, TW peak power lasers. Complementary to the LPA-based approach, state-of-the-art cavity-based accelerators can produce monoenergetic beams with extremely high average power; with a 1 kHz overall repetition rate or higher, and moderate beam loading of the RF structure (100 beam pulses per 4 µs RF fill), one may obtain 200 µA of average current from giving a beam power equivalent to that of typical clinical linac (linear accelerator). It is a feature of the present invention to convert these monoenergetic beams into beams with exponential-power-law energy distribution, or similar energy distribution spectra, making use of plasma wakefield acceleration in a plasma cell. An additional advantage of this method is that the plasma cell can be turned on or off (e.g., by moving the plasma cell into the beam or out of the beams trajectory), so that the unmodified, monoenergetic beams can be used for traditional, monoenergetic testing of electronics, as well as for benchmarking. When a beam with broad energy spectra is required, the plasma cell is turned on in order to generate the spectrum as required.

To convert the energy distribution of this initially quasi-monoenergetic stream of electrons, the method of the second aspect of the invention is configured to use the PWFA in the blowout regime, where the beam density $n_b$ exceeds the ambient plasma electron density $n_0$. In other words, $n_b > n_0$, and preferably, the ratio $n_b$, $n_0$ is in the range of from 1 to 2. With an rms bunch length $\sigma_\zeta$ of 600 µm (2 ps), and the condition for most efficient wakefield deceleration on the beam $k_p \sigma_\zeta \approx 2$ (a preferable range according to this invention is between 1 and 3), where the plasma wave-number $k_p = \sqrt{4\pi r_e n_0}$, we are able to deduce that $n_0 \approx 3 \times 10^{14}$ cm$^{-3}$.

This scenario was simulated using a 2D state-of-the-art particle-in-cell computer simulation code. In order to achieve the blowout regime, where the beam propagates with the transverse beam size a stabilized through ion focusing, the beam should be smaller than $\sigma_x \approx 200$ µm. This condition can be satisfied by use of strong solenoidal focusing.

The beam longitudinal head is not strongly affected by the causal longitudinal plasma wakefields, while the core, with largest linear density, is strongly decelerated. The tail of the beam, $\zeta < -2\sigma_\zeta$, with much smaller linear density, is accelerated at up to twice the maximum rate of deceleration in the core. By decelerating the core until it begins to become non-relativistic, one obtains an approximately exponential momentum (nearly equivalent to the energy in the relativistic regime) spectrum from 2 to 10 MeV/c. See, FIG. 9.

Thus, the second aspect of the present inventive method comprises utilizing a PWFA system as above described to generate a high energy beam having radiation energy distribution properties that simulate the radiation energy distribution properties found in space. Using a beam with such properties, electronic components are tested for radiation hardness using known test protocols.

Finally, the first and the second aspect of the invention can be combined, in order to generate exponential and power-law spectra with extremely steep decline. To this end, an exponential beam from a LPA is sent into a plasma cell, where further modification of the spectrum is imposed.

Thus, it is seen that the solution of the present invention provides novel and useful features for overcoming shortcomings in the prior art. The present invention may, of course, be carried out in other specific ways than those herein set forth without departing from the essential characteristics of the invention. The present embodiments are, therefore, to be considered in all respects as illustrative and not restrictive, and all changes coming within the meaning and equivalency range of the appended claims are intended to be embraced therein.

We claim:

1. A method of testing the sensitivity of an electronic component against radiation, wherein plasma excitation is used for generating a radiation beam, the method comprising:
    using plasma-wakefield acceleration to generate the plasma excitation;
    varying at least one beam parameter selected from the group consisting of: laser pulse energy, laser prepulse energy, electric drive pulse energy, beam duration, beam focus, beam size, beam wavelength, beam pulse, beam shape, and beam density; and
    producing a radiation beam having an energy distribution that is exponential or power-law;
    irradiating an electronic component with the radiation beam;
    wherein the exponential energy distribution is substantially the same as radiation energy distribution which occurs in the Earth's radiation belts.

2. The method of claim 1, wherein the plasma excitation is laser-plasma-acceleration.

3. The method of claim 1, further including
    varying at least one target material parameter selected from the group consisting of: physical state (solid, liquid, gaseous or plasma), thickness, density, material, composition, structure, temperature, and shape; and, thereby
    producing different types of particle beams in a single beam, including at least two particle beams selected from the group of particles consisting of: electrons, protons, ions, neutrons and photons.

4. A method of testing the sensitivity of an electronic component against radiation, wherein plasma excitation is used for generating a radiation beam, the method comprising:
    using plasma-wakefield acceleration to generate the plasma excitation;
    varying at least one beam parameter selected from the group consisting of: laser pulse energy, laser prepulse energy, electric drive pulse energy, beam duration, beam focus, beam size, beam wavelength, beam pulse, beam shape, and beam density; and
    varying at least one target material parameter selected from the group consisting of: physical state (solid, liquid, gaseous or plasma), thickness, density, material, composition, structure, temperature, and shape; and, thereby producing different types of particles beams in a single radiation beam, including at least two particle beams selected from the group of particles consisting of: electrons, protons, ions, neutrons and photons; and irradiating an electronic sample with the single beam;

wherein the exponential energy distribution is substantially the same as radiation energy distribution which occurs in the Earth's radiation belts.

5. The method of claim 4, wherein producing a single radiation beam includes producing a beam with an energy distribution that is exponential.

\* \* \* \* \*